United States Patent [19]
DeJong et al.

[11] Patent Number: 5,311,054
[45] Date of Patent: May 10, 1994

[54] GRADED COLLECTOR FOR INDUCTIVE LOADS

[75] Inventors: Glenn A. DeJong, Merritt Island, Fla.; Gregory J. Scott, Pocatello, Id.; Akira Ito, Palm Bay, Fla.

[73] Assignee: Harris Corporation, Melbourne, Fla.

[21] Appl. No.: 674,147

[22] Filed: Mar. 25, 1991

[51] Int. Cl.$^5$ ............................................. H01L 29/72
[52] U.S. Cl. .................................. 257/565; 257/487; 257/655
[58] Field of Search ................. 357/34, 41; 257/655, 257/565, 487

[56]  References Cited
U.S. PATENT DOCUMENTS

| | | | |
|---|---|---|---|
| 3,916,431 | 10/1975 | Khajezadeh | 257/565 |
| 4,388,634 | 6/1983 | Amantea et al. | 257/487 |
| 4,947,231 | 8/1990 | Palara et al. | 357/34 |
| 4,972,247 | 11/1990 | Patterson et al. | 357/34 |
| 4,980,738 | 12/1990 | Welch et al. | 357/34 |
| 4,985,741 | 1/1991 | Baur et al. | 357/34 |
| 4,996,581 | 2/1991 | Hamasaki | 357/34 |

FOREIGN PATENT DOCUMENTS 328286  8/1989  European Pat. Off. .

Primary Examiner—James W. Davie
Attorney, Agent, or Firm—Nixon, Hargrave, Devans & Doyle

[57] ABSTRACT

A bipolar transistor having an improved collector structure includes a buried region of the same conductivity type as the collector region spaced from the base region and having a laterally graded impurity concentration with the lowest below the center of the emitter region. An integrated circuit may include transistors having the buried collector region of the diminishing lateral impurity concentration below the center of its emitter as well as having transistors with a uniform lateral impurity concentration below the total lateral extent of the emitter. A method of achieving the unique collector region includes forming at least a first collector region of a first conductivity type as two lateral portions of substantially uniform lateral impurity concentration with a space therebetween in a substrate of a second conductivity type and heating to form the buried collector struture of diminishing lateral impurity concentration. This is followed by forming a collector layer on the substrate, forming a base region in the collector region and an emitter region in the base region over the space in the buried collector region. If the integrated circuit includes transistors which do not have the unique graded collector, the buried collector region for these transistors is formed by introducing impurities having substantially uniform lateral impurity concentration in the substrate.

7 Claims, 4 Drawing Sheets

GRADED COLLECTOR FOR INDUCTIVE LOADS

BACKGROUND AND SUMMARY OF THE INVENTION

The present invention relates generally to bipolar transistors and more specifically to an improved transistor for use with inductive loads.

A bipolar transistor formed according to the prior art is illustrated in FIG. 1 as including a P substrate 10 having an N buried subcollector 12 formed therein between the substrate 10 and an N− epitaxial collector region 14. The base region 16 is a P type with extrinsic base portion 17. An N+ emitter 18 is formed in the base region 16. The impurity concentration distribution of the epitaxial collector 14 and the subcollector 12 is shown specifically in FIG. 2 by curve A. The abrupt transition between the collector 14 and the buried collector region 12 minimizes the amount of the collector region 14 of the low impurity concentration between the base region 16 and the buried collector 12. Thus the series resistance of the collector is very low. The abrupt transition results from the processing with a minimum of out-diffusion of the buried collector 12 into the epitaxial layer collector 14. This also reduces the variability in the active portion of the collector 14 between the buried layer 12 and the base region 16.

During turn-off, due to the voltage drop from the lateral flow of base current, the edge of the base region adjacent 17 turns off faster than the portion of the base region 16 below the emitter region 18. This is illustrated by the variable resistance and the arrows in FIG. 1. Low collector resistance allows a strong focus of current at the center of the emitter during inductor turn-off. Thus, there is a hot spot under the center of the emitter region. The abrupt profile of the N−/N+ collector regions 14/12 creates higher fields at higher emitter currents. A secondary breakdown results from inductive loads when the transistor is turned off. The lack of defocusing during the turn-off is very detrimental because of the high fields and currents below the emitter, causes transistor burn-out at hot spots.

One approach of the prior art to reduce the peak current density under the emitter is to spread fields by providing a graded collector region 14. This is produced by a substantial out-diffusion of the subcollector 12 into the epitaxial layer 14 after it is formed. To achieve the same active collector region 14 between curves A and B of FIG. 2, the sub or buried collector region 12' is substantially greater in depth than that of buried collector region 12 of curve A, i.e., more epitaxial deposition is required. Also because of the amount of time that must be diffused as well as its depth, the controlability of the resulting region 14 is substantially less for graph B as it is for graph A. Also, the effective resistivity of the combination of collector portion 14 and 12' is substantially greater than that of 14 and 12, thereby increasing the overall collector resistance, which also limits the performance and packing density elsewhere on an integrated circuit.

Thus, there is a need for providing the turn-off ruggedness of a graded collector region with the low resistance of an abrupt collector region.

Thus, it is an object of the present invention to provide a collector region which combines the advantages of a graded collector region and an abrupt collector region.

Another object of the present invention is to provide an improved bipolar transistor having a collector region designed specifically for inductive loads.

Still another object of the present invention is to provide a transistor structure which can be individually tailored in an integrated circuit without extra steps.

These and other objects are achieved by providing a buried region of the same conductivity type as the collector region spaced from the base region and having a substantially uniform lateral impurity concentration except below the center of the emitter region where it has a decreasing impurity concentration range. This defocuses and spreads the field and current concentration in the collector directly below the emitter and yet maintains a low collector resistance. The impurity concentration of the buried collector region below the emitter region decreases laterally towards below the center of the emitter region. The impurity concentration of the buried region below the center of the emitter region is less than the remainder of the buried collector region and may be slightly higher or lower than the collector region or may be the impurity concentration of the collector region. Where the substrate is a different impurity conductivity type than the collector region, the buried collector region extends into the collector region and the substrate. An integrated circuit may include transistors having the buried collector region of the diminishing lateral impurity concentration below the center of its emitter region as well as having transistors with a uniform lateral impurity concentration below the total lateral extent of its emitter region.

A method of achieving the unique collector region includes forming at least a first collector region of a first conductivity type as two lateral portions substantially uniform lateral impurity concentration with a space therebetween in a substrate of a second conductivity type. This is followed by forming a collector layer of a first conductivity type on the substrate, forming a base region of the second conductivity type in the collector region and forming an emitter region of the first conductivity type in the base region over the space in the buried collector region. The lateral portions of the buried collector region are formed having an impurity concentration below the emitter decreasing laterally towards the center of the emitter. The impurity concentration at the center is less than the remainder of the buried collector portion and may be either slightly higher than the collector layer or be the impurity concentration of the collector layer.

The buried collector region is formed by introducing impurities of a first conductivity type into the substrate in two regions with a first space therebetween. It is followed by heating the substrate to diffuse the impurities vertically and laterally into the substrate to form the two portions of substantially uniform lateral impurity concentration except in the first space which has diminishing lateral impurity concentrations, thus providing a laterally graded collector. Alternatively, impurities of the first buried collector region may be formed by introducing impurities of the first conductivity type and first concentration into the substrate in two regions with a first space therebetween. Impurities of a first conductivity type and a second concentration lower than the first concentration or a faster diffusion rate are introduced into the first space. Subsequently, the substrate is heated to diffuse impurities into the substrate to form the two portions of the same substantially uniform lateral impurity concentration separated by the first space of lower substantially uniform lateral impurity concentration. If the integrated circuit is to include transistors which do not have the unique graded collector, the buried collector region for these transistors is formed by introducing impurities having substantially uniform lateral impurity concentration in the substrate and forming with the base and emitter region thereover such that the buried collector region has substantially uniform impurity concentration under the emitter region.

Other objects, advantages and novel features of the present invention will become apparent from the following detailed description of the invention when considered in conjunction with the accompanying drawings.

DETAILED DESCRIPTION OF THE DRAWINGS

Figure 3:
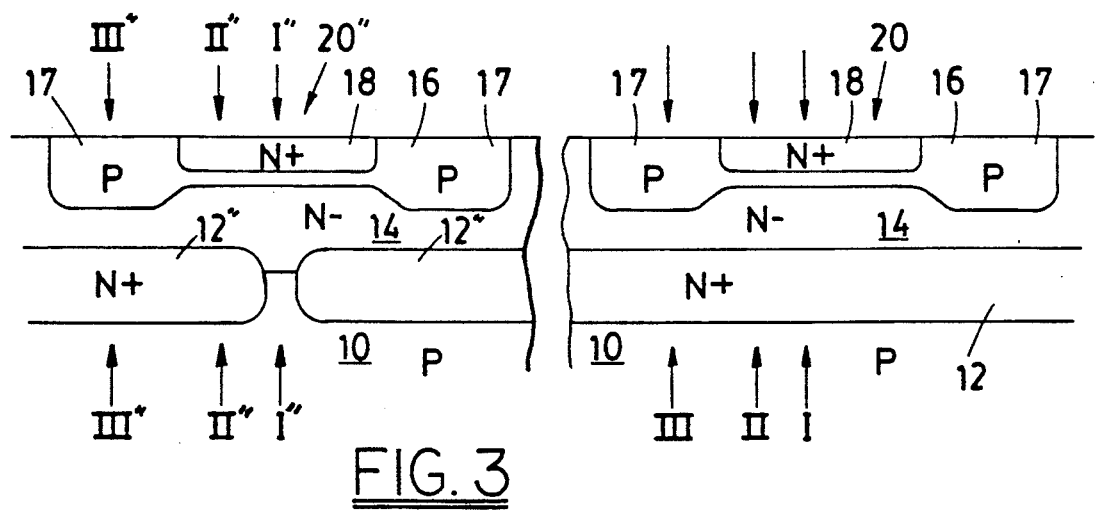
FIG. 3 is a cross-sectional view of an integrated circuit including a transistor of the prior art and the present invention.

An integrated circuit is illustrated in FIG. 3 as including a prior art bipolar transistor 20 and a bipolar transistor 20" according to the principles of the present invention. As in FIG. 1, the prior art transistor 20 includes a substrate 10 with a buried collector region 12, collector layer or region 14, a base region 16, 17 and an emitter region 18. The bipolar transistor 20" is also built in the substrate 10 having a buried collector region 12", a collector layer or region 14, a base region 16, 17 and an emitter region 18. For purposes of illustration, both transistors are shown as NPN transistors wherein the substrate 10 is P, the buried region 12 and 12" are N+, the collector layer 14 is N−, the base regions 16, 17 are P and the emitter 18 is N+. Those regions having common characteristics in transistor 20 and 20" have the same reference number. The lateral impurity concentration of buried collector region 12 of transistor 20 is substantially uniform whereas the lateral impurity concentration of buried collector region 12" in FIG. 3 is substantially uniform except under the emitter region 18 where it decreases to the value of N− of the collector 14 or some value slightly higher than the N− value of collector 14 but lower than the N+ value of the remainder of the buried collector 12". Alternatively, the buried collector region may also have an impurity concentration lower than N− of the collector 14, although less desirable in some applications.

Figure 2:
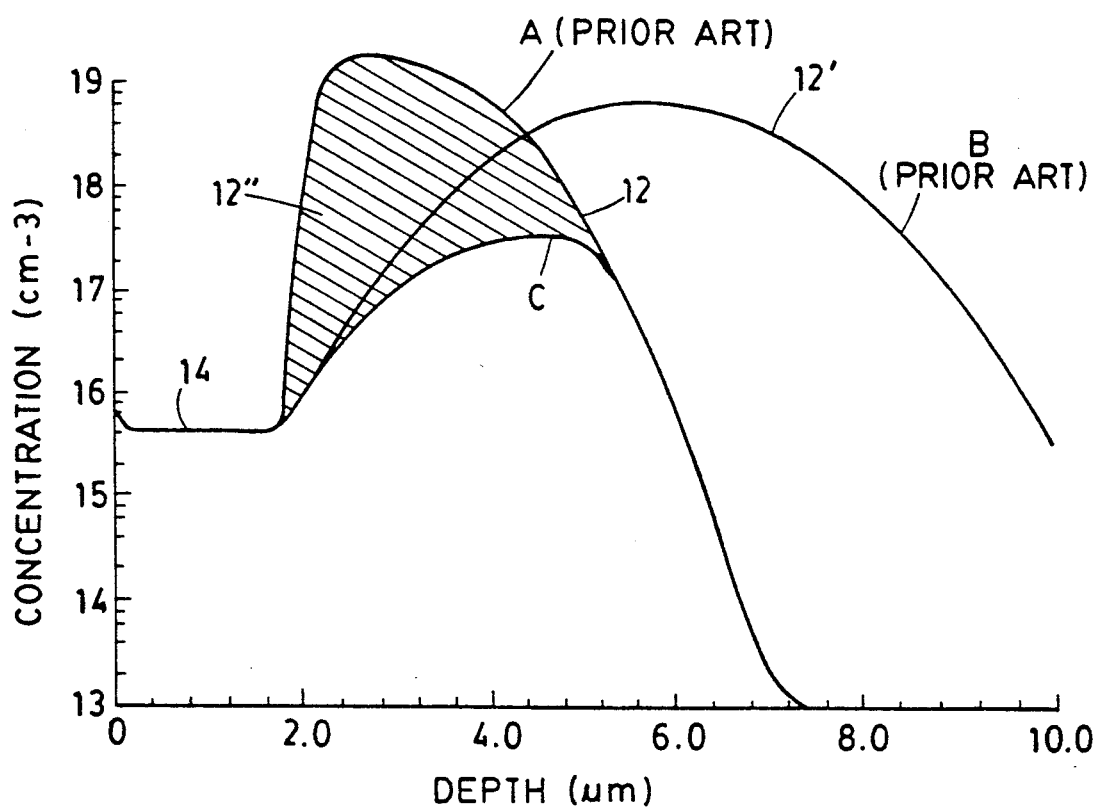
FIG. 2 is a graph representing the impurity concentration versus depth comparing the prior art to the present invention.

As illustrated in FIG. 2, the abrupt change of transistor 20 is illustrated by the curve A which shows impurity concentration of the collector at depths from the surface of the wafer. Curve 12' is the collector concentration where the buried layer 12 has been substantially out-diffused into the collector layer 14. This is not illustrated in the figures other than the graph of FIG. 2. The desired concentration for the collector region 12" is illustrated by the cross-hatched regions and depends upon where the cross-section is taken. The collector concentration below the base portion 17 and not under the emitter region 18 is illustrated by the prior art curve A. A cross-section taken through the center of the emitter 18 through the collector regions 14 and 12" is illustrated by curve C. The cross-sections between these two extremes are the cross-hatched area. In curve C, the minimum impurity concentration of the buried layer 12" rises slightly above that of the collector region 14 and then decreases rapidly as does curve A. This is in contrast to a substantially uniform rate of grading of curve B. Although the buried layer portion 12" is illustrated in FIG. 3 as not extending totally below the emitter 18, because of the lateral diffusion characteristics of the impurities, there is generally a slight increase in impurity concentration of layer 14 even at the center of the emitter region 18, although not always required.

Figure 4:
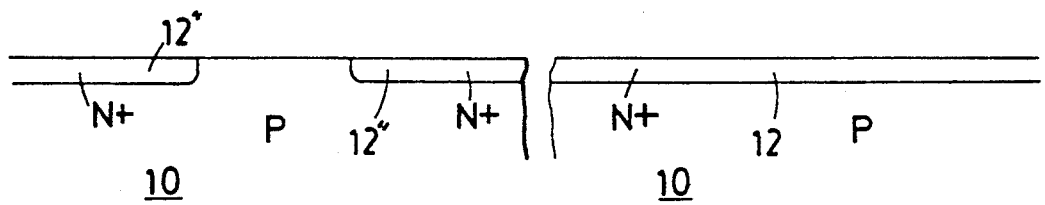
FIGS. 4-6 are cross-sectional views of a wafer during various stages of fabrication according to the principles of the present invention.
Figure 5:
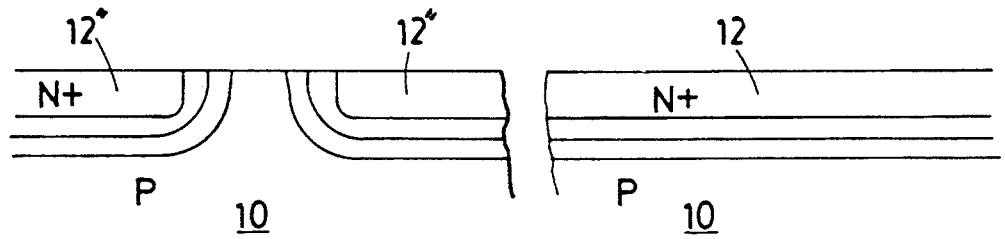

The process for producing the integrated circuit of FIG. 3 begins as in FIG. 4 by providing impurities of the N conductivity type in the P substrate 10. The portions where high performance transistors are to be formed, the impurity is introduced uniformly. In the regions where the improved collector region of transistor 20" is to be formed, the impurity is introduced with a space therebetween above which the emitter region is to be formed. This is illustrated as regions 12 and 12" in FIG. 4. The substrate is then subjected to a heating step to diffuse the impurities to form the regions as illustrated in FIG. 5. The series of lines illustrate the impurity distribution. As noted, the region 12 for transistor 20 has a substantially uniform lateral distribution whereas the region 12" has two portions of substantially uniform lateral impurity concentration and diminishes toward the center.

Figure 1:
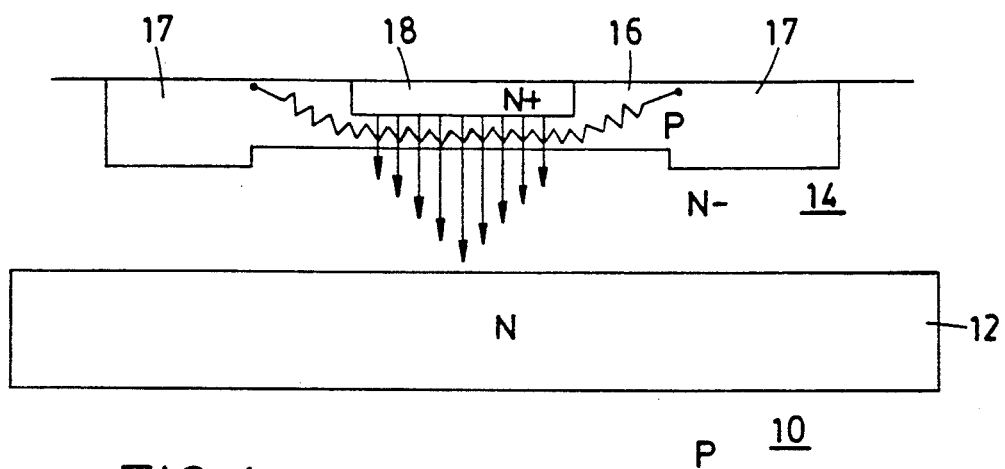
FIG. 1 is a cross-section of a bipolar transistor of the prior art.
Figure 6:
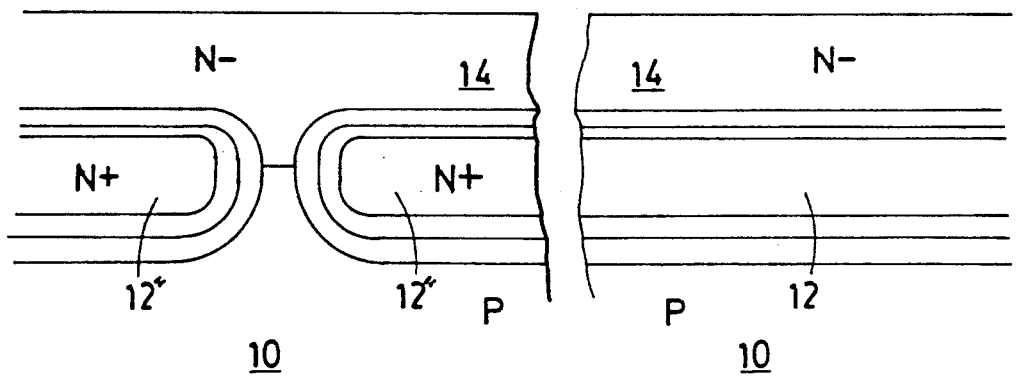

Next, the collector layer 14 is formed preferably by epitaxial deposition. This results in some out-diffusion of the buried regions 12 and 12" into the epitaxial layer 14. The impurity concentration is illustrated in FIG. 6 to represent the final distribution after all the process even though they are not shown specifically in FIG. 6. By performing the heat step of FIG. 5 prior to forming the epitaxial layer 14 of the collector, only a small portion of the epitaxial layer 14 includes out-diffusing impurities from the buried region 12 and 12". Thus, the control factor of the prior art transistor of FIG. 1 or 20 is included in the 20" transistor. This is distinguished from the curve B and 12' of the prior art uniformly graded collector region which is very difficult to control.

Figure 7:
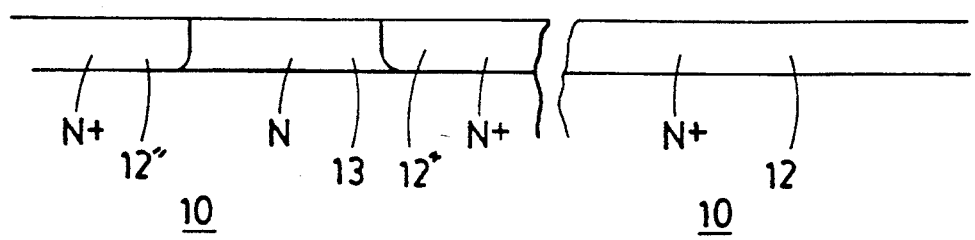
FIGS. 7 and 8 are cross-sectional views of a modified process according to the principles of the present invention.

To even further control the impurity concentration of the buried collector region 12" to match the curve C of FIG. 2, a modification is shown in FIG. 7. After forming the buried N+ regions 12 and 12" with a space therein, a second N type region 13 in the opening between 12" is formed. The impurity concentration of the region 13 is lower than that of 12" but generally higher than that of the resulting N− impurity concentration of the epitaxial region 14, although the impurity concentration may be equal to or lower than the impurity concentration of epitaxial region 14. A heating step is performed and an epitaxial layer 14 is formed thereon resulting in the structure of FIG. 8. Transistor 20 then has a buried collector region 12 of uniform lateral impurity concentration whereas transistor 20" has a buried region 12" of a first uniform lateral impurity concentration except at its center 13 which has a second uniform lateral impurity concentration of a lower impurity concentration than 12".

Figure 8:
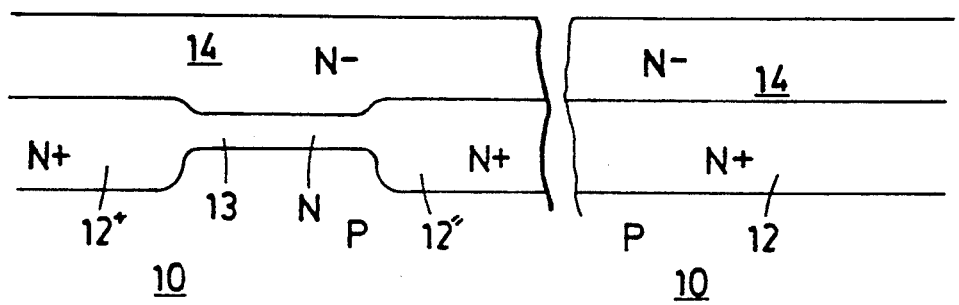

Although the thickness of region 13 is shown thinner than region 12" in FIG. 8, the process could be performed to produce equal depths and still provide lateral grading. In the process of FIG. 7, the impurities for region 13 could have a faster diffusion rate than the impurities of region 12". For example, region 12" could be arsenic and region 13 phosphorus. The deposition or implantation concentration may be equal and result in unequal diffused impurity concentration. Also, the region 13 can be deposited or implanted and diffused before the processing of region 12", thereby resulting in equal or greater depth for region 13 than region 12" and lower impurity concentration.

Figure 9:
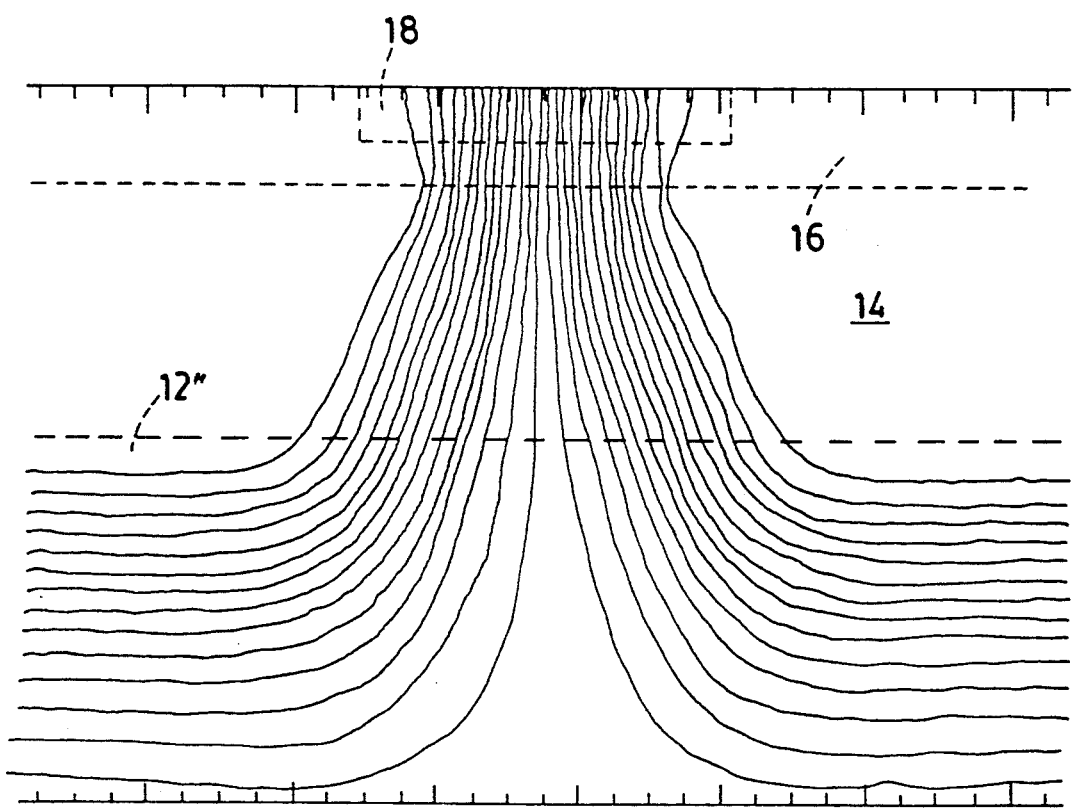
FIG. 9 is a diagram of the current flow during turn-off of a transistor of the present invention.

The current flow of transistor 20" according to the present invention during turn-off is illustrated in FIG. 9. There is no excessive concentration of the current or forming of hot spots below the center of the emitter. Also, the edge of the transistor turns off first as discussed with respect to FIG. 1.

Figure 10:
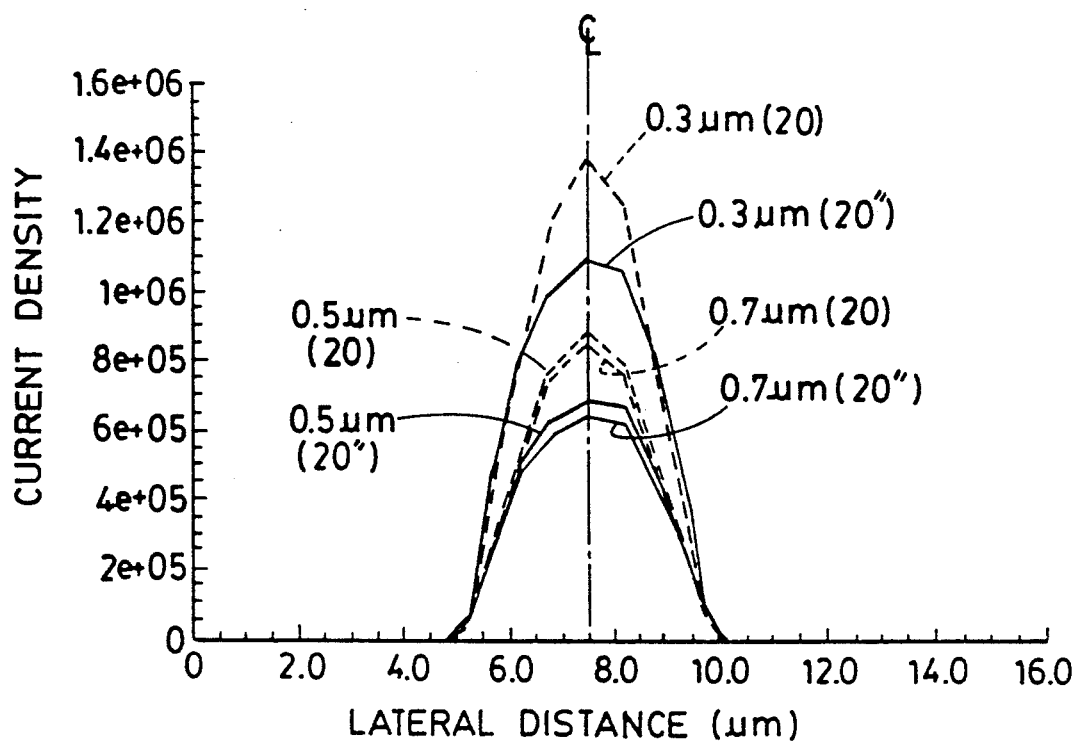
FIG. 10 is a graph comparing the current density versus lateral distance between the transistor of the present invention and the prior art.

The current density under the emitter of transistors 20 and 20" is illustrated in FIG. 10. The distance is the distance along the surface with the center line of the transistor being illustrated. The family of curves are for the depths of 0.3 microns, 0.5 microns and 0.7 microns. The prior art or abrupt collector transistor 20 is represented by the dashed line graphs whereas the transistor 20" of the present invention is illustrated by the solid line graphs for each of the family of curves.

Figure 11:
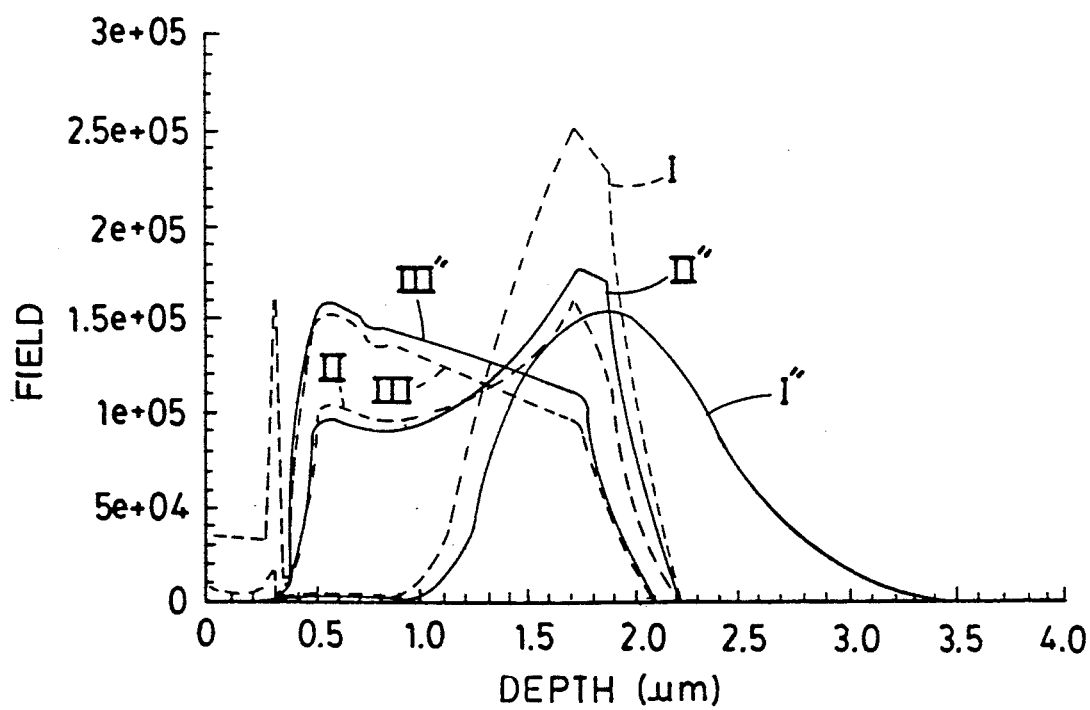
FIG. 11 is a graph of the electric field versus depth under the emitter comparing the present invention with that of the prior art.

The comparison of the electric field under the emitter of transistor 20 and 20" are illustrated in the graphs of FIG. 11. The solid line represents transistor 20" while the dashed graphs illustrated transistor 20. The roman numerals I, II and III illustrate the cross-sections taken in FIG. 3. I and I" are taken at the center of the emitter region and illustrate a substantial reduction in the electric field below the center of the emitter region. This aids the transistor in operating with the large currents resulting from the turn-off of the transistor when operating with an inductive load. Comparing the other curves of II to II" and III to III", it is noted that the electric fields of 20" are slightly higher than that of the transistor 20 of the prior art. This results from the reduction of the electric field and reduced current focus at the center of the emitter. These small increases in the electric field at positions II and III do not substantially change the performance of the transistor.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method for controlling current to an inductive load from a bipolar transistor,
    wherein the bipolar transistor comprises:
    a collector of a first conductivity type;
    a base region of a second conductivity type in said collector;
    an emitter region of said first conductivity type in said base region for connection to the inductive load; and
    a buried collector region of said first conductivity type in said collector for a second connection to the inductive load to provide a complete circuit, said buried collector spaced from said base region, said buried collector region having an impurity concentration laterally graded from a high impurity concentration higher than the impurity concentration of said collector to a low impurity concentration below the center of said emitter region said low impurity concentration being approximately the impurity concentration of the collector; and
    the method comprising the step of providing a reduced peak current density under the emitter region during inductive load turn-off relative to a current density that would result with a uniform concentration of impurity along the buried collector region, and which avoids transistor burn-out.

2. An integrated circuit for inductive loads comprising:
    a first transistor having a base region located in a collector region of a first conductivity type, an emitter region of said first conductivity type in said base region, and a buried collector region of said first conductivity type having a laterally uniform impurity concentration; and
    a second transistor having a base region located in a collector region of the first conductivity type, an emitter region of said first conductivity type in said base region, and a second buried collector region of said first conductivity type having a laterally graded impurity concentration with the lowest impurity concentration below the center of said second emitter region of said second transistor, said lowest impurity concentration having approximately the concentration of the collector.

3. An integrated circuit for inductive loads according to claim 2 wherein the impurity concentration of the buried collector region of said second transistor is substantially uniform laterally except below said emitter region of said second transistor where it decreases laterally towards below the center of the emitter region of said second transistor.

4. An integrated circuit for inductive loads according to claim 3 wherein the impurity concentration of the buried collector region of said second transistor below the center of the emitter region of said second transistor decreases to an impurity concentration ranging from slightly less than to slightly greater than the impurity concentration of said collector region of said second transistor.

5. An integrated circuit for inductive loads according to claim 2 wherein the impurity concentration of the buried collector region of said second transistor is substantially uniform laterally except below the center of the emitter region of said second transistor where it has a decreased substantially uniform lateral impurity concentration.

6. An integrated circuit for inductive loads according to claim 2 where said collector regions are a first layer of said first conductivity type on a second layer of said second conductivity type and said buried collector regions extend into said first and second layers.

7. An integrated circuit for inductive loads according to claim 6 wherein said first layer has a thickness less than three microns.

* * * * *